(12) United States Patent
Hayashi

(10) Patent No.: US 9,228,118 B2
(45) Date of Patent: Jan. 5, 2016

(54) PRODUCTION METHOD FOR POLYAMIDE ACID PARTICLES, PRODUCTION METHOD FOR POLYIMIDE PARTICLES, POLYIMIDE PARTICLES AND BONDING MATERIAL FOR ELECTRONIC COMPONENT

(75) Inventor: Satoshi Hayashi, Osaka (JP)

(73) Assignee: SEKISUI CHEMICAL CO., LTD., Osaka (JP)

(*) Notice: Subject to any disclaimer, the term of this patent is extended or adjusted under 35 U.S.C. 154(b) by 177 days.

(21) Appl. No.: 13/993,808

(22) PCT Filed: Dec. 14, 2011

(86) PCT No.: PCT/JP2011/078899
§ 371 (c)(1),
(2), (4) Date: Jul. 8, 2013

(87) PCT Pub. No.: WO2012/081615
PCT Pub. Date: Jun. 21, 2012

(65) Prior Publication Data
US 2013/0289156 A1    Oct. 31, 2013

(30) Foreign Application Priority Data

Dec. 17, 2010   (JP) ................................. 2010-282020
Mar. 3, 2011    (JP) ................................. 2011-046613
Mar. 23, 2011   (JP) ................................. 2011-064744

(51) Int. Cl.
| | | |
|---|---|---|
| C09J 179/08 | (2006.01) | |
| C08L 3/14   | (2006.01) | |
| C08J 3/14   | (2006.01) | |
| H01L 23/29  | (2006.01) | |

(Continued)

(52) U.S. Cl.
CPC ............. *C09J 179/08* (2013.01); *C08G 73/105* (2013.01); *C08G 73/1025* (2013.01); *C08G 73/1067* (2013.01); *C08G 73/1071* (2013.01); *C08G 73/1085* (2013.01); *C08G 73/22* (2013.01); *C08J 3/14* (2013.01); *C09J 177/06* (2013.01); *H01L 23/293* (2013.01); *H01L 24/27* (2013.01); *H01L 24/29* (2013.01); *H01L 24/81* (2013.01); *H01L 24/83* (2013.01); *C08J 2379/08* (2013.01); *H01L 24/13* (2013.01); *H01L 24/14* (2013.01); *H01L 24/16* (2013.01); *H01L 24/32* (2013.01); *H01L 24/73* (2013.01); *H01L 24/92* (2013.01); *H01L 2224/131* (2013.01); *H01L 2224/14135* (2013.01); *H01L 2224/16225* (2013.01); *H01L 2224/16227* (2013.01); *H01L 2224/2732* (2013.01); *H01L 2224/27416* (2013.01); *H01L 2224/27436* (2013.01); *H01L 2224/2929* (2013.01); *H01L 2224/2939* (2013.01); *H01L 2224/2949* (2013.01); *H01L 2224/29387* (2013.01); *H01L 2224/29388* (2013.01); *H01L 2224/32225* (2013.01); *H01L 2224/73203* (2013.01); *H01L 2224/81191* (2013.01); *H01L 2224/81203* (2013.01); *H01L 2224/81447* (2013.01); *H01L 2224/81815* (2013.01); *H01L 2224/8385* (2013.01); *H01L 2224/83191* (2013.01); *H01L 2224/83203* (2013.01); *H01L 2224/9211* (2013.01); *H01L 2924/01012* (2013.01); *H01L 2924/01029* (2013.01); *H01L 2924/15788* (2013.01); *H01L 2924/351* (2013.01)

(58) Field of Classification Search
CPC ........... C08G 73/1025; C08G 73/1007; C08G 73/1003; C08J 3/28; C08J 179/08; C08J 3/14; C08J 2379/08; C08L 79/08
See application file for complete search history.

(56) References Cited

U.S. PATENT DOCUMENTS

| | | | | |
|---|---|---|---|---|
| 4,098,800 A | * | 7/1978 | Banucci et al. ................ | 549/241 |
| 4,413,117 A | * | 11/1983 | Reiter et al. ................... | 528/497 |

(Continued)

FOREIGN PATENT DOCUMENTS

| | | |
|---|---|---|
| CN | 1246489 | 3/2000 |
| CN | 101089030 | 12/2007 |

(Continued)

OTHER PUBLICATIONS

Ding et al. Preparation, Characterization, and Properties of polyamic acid nano-emulsion. Polymers of Advanced Technologies. vol. 22, Issue 12, pp. 2633-2637. (Dec. 2011).*

(Continued)

*Primary Examiner* — Sanza McClendon
(74) *Attorney, Agent, or Firm* — Wenderoth, Lind & Ponack, L.L.P.

(57) ABSTRACT

An object of the present invention is to provide a method for producing polyamide acid particles which is used as a raw material for polyimide particles with a small average particle diameter having high heat resistance. Other objects of the present invention are to provide a method for producing polyimide particles using the method for producing polyamide acid particles, and polyimide particles produced by the method for producing polyimide particles. Yet another object of the present invention is to provide a bonding material for an electronic component, which has a low linear expansion coefficient and a low elastic modulus after being cured in the temperature range equal to or less than the glass transition temperature, so that a joined body with high reliability can be produced. The present invention is a method for producing polyamide acid particles having a step of preparing a solution having a diamine compound dissolved, and a step of precipitating polyamide acid particles by adding a tetracarboxylic anhydride in a non-solution state to the solution having a diamine compound dissolved while applying a physical impact thereto.

6 Claims, No Drawings

(51) Int. Cl.
  *C09J 177/06*   (2006.01)
  *C08G 73/10*    (2006.01)
  *C08G 73/22*    (2006.01)
  *H01L 23/00*    (2006.01)

(56) References Cited

U.S. PATENT DOCUMENTS

| | | | |
|---|---|---|---|
| 6,187,899 B1 * | 2/2001 | Asao et al. | 528/332 |
| 6,335,418 B1 * | 1/2002 | Asao et al. | 528/170 |
| 6,780,960 B2 * | 8/2004 | Hausladen et al. | 528/170 |
| 2008/0269457 A1 * | 10/2008 | Samukawa | 528/336 |
| 2009/0134364 A1 * | 5/2009 | Nawafune et al. | 252/513 |
| 2012/0164455 A1 * | 6/2012 | Griffin et al. | 428/413 |

FOREIGN PATENT DOCUMENTS

| | | |
|---|---|---|
| EP | 982343 A2 * | 3/2000 |
| EP | 1182229 A1 * | 2/2002 |
| JP | 3-263463 | 11/1991 |
| JP | 2000248063 A * | 9/2000 |
| JP | P3478977 | 10/2003 |
| JP | 2004-292682 | 10/2004 |
| JP | 2006052268 A * | 2/2006 |
| JP | 2006-182845 | 7/2006 |
| JP | 2006182845 A * | 7/2006 |
| JP | 2006249380 A * | 9/2006 |
| JP | 2007-217487 | 8/2007 |
| JP | 2008-150573 | 7/2008 |
| JP | 2008-222958 | 9/2008 |
| JP | 2008222958 A * | 9/2008 |
| JP | 2010-189524 | 9/2010 |
| JP | 2010-239106 | 10/2010 |
| TW | 201000306 | 1/2010 |

OTHER PUBLICATIONS

Asao et al. Size Control of Polyamic Acid Particles in Precipitation Polymerization by Using Solubility Parameters. Kagaku Kogaku Ronbunshu. vol. 38, No. 1, pp. 39-44 (2012).*
International Search Report issued Feb. 28, 2012 in corresponding International (PCT) Application No. PCT/JP2011/078899.

* cited by examiner

PRODUCTION METHOD FOR POLYAMIDE ACID PARTICLES, PRODUCTION METHOD FOR POLYIMIDE PARTICLES, POLYIMIDE PARTICLES AND BONDING MATERIAL FOR ELECTRONIC COMPONENT

TECHNICAL FIELD

The present invention relates to a method for producing polyamide acid particles which are used as a raw material for polyimide particles with a small average particle diameter having high heat resistance. The present invention also relates to a method for producing polyimide particles using the method for producing polyamide acid particles and polyimide particles produced by the method for producing polyimide particles. The present invention further relates to a bonding material for an electronic component, which has a low linear expansion coefficient and a low elastic modulus after being cured in the temperature range equal to or less than the glass transition temperature, so that a joined body with high reliability can be produced.

BACKGROUND ART

In production method for a semiconductor device, an adhesive, a die attachment film, or the like which contains liquid epoxy as a main component is used for joining a semiconductor chip to a substrate or the like. The properties of not generating stress to the extent possible in a joined semiconductor chip are required for the adhesive. The stress generated in a semiconductor chip may cause conduction failure in the semiconductor device, due to, for example, detachment between the substrate and the semiconductor chip, or between semiconductor chips facing each other.

Examples of major factors in generating stress in a semiconductor chip include the difference in temperature dependence of shrinkage ratio (linear expansion coefficient) between the semiconductor chip and the cured adhesive material in a step of cooling the adhesive from the heat-curing temperature. In a conventional method, the adhesive is densely filled with an inorganic filler so as to reduce the linear expansion coefficient of the cured adhesive material. Although the cured adhesive material densely filled with an inorganic filler has a reduced linear expansion coefficient, it also has an increased elastic modulus, causing difficulty in sufficiently suppressing the detachment of a semiconductor chip.

In order to deal with the problem, an attempt to use polyimide particles as a filler was made to suppress the increase of the elastic modulus of the cured adhesive material while reducing the linear expansion coefficient. For example, Patent Literature 1 discloses a circuit connecting material having excellent connection reliability and connection appearance, which contains an adhesive composition, conductive particles, and a plurality of insulating particles including one or both of polyamic acid particles and polyimide particles.

In recent years, further downsizing and higher integration have been required for semiconductor devices. The downsizing and thinning of semiconductor chips are thus increasingly ongoing. The polyimide particles having an oversized particle diameter cause problems such that the polyimide particles form foreign substances in an adhesive, that the polyimide particles are pinched during joining of the semiconductor chips, and that the adhesive is not thinned. A method for producing polyimide particles having a smaller particle diameter is therefore required.

Patent Literature 2 discloses, as a method for producing polyimide particles having a small particle diameter, a method for synthesizing polyimide from tetracarboxylic anhydride and diamine compound. Patent Literature 2 discloses a method for producing polyimide particles including: a first step (a) of preparing each of a first solution containing a tetracarboxylic anhydride and a second solution containing a diamine compound; a second step (b) of mixing the first solution and the second solution so as to obtain polyamide acid particles precipitated out of the mixed solution; and a third step (c) of producing polyimide particles through imidization of the obtained polyamide acid particles.

The use of polyimide particles as a substitute for an inorganic filler causes new problems such that the polyimide particles are decomposed under high temperature during production of a semiconductor device and that the voids are generated in an adhesive due to gas generation from the polyimide particles. High heat resistance is, therefore, also required for the polyimide particles. However, polyimide particles having a sufficiently small particle diameter and high heat resistance have not been obtained by any conventional method.

CITATION LIST

Patent Literature

Patent Literature 1: Japanese Kokai Publication No. 2008-150573 (JP-A 2008-150573)
Patent Literature 2: Japanese Patent No. 3478977 (JP-B 3478977)

SUMMARY OF INVENTION

Technical Problem

An object of the present invention is to provide a method for producing polyamide acid particles which is used as a raw material for polyimide particles with a small average particle diameter having high heat resistance. Another object of the present invention is to provide a method for producing polyimide particles using the method for producing polyamide acid particles and polyimide particles produced by the method for producing polyimide particles. A further object of the present invention is to provide a bonding material for an electronic component, which has a low linear expansion coefficient and a low elastic modulus after being cured in the temperature range equal to or less than the glass transition temperature, so that a joined body with high reliability can be produced.

Solution to Problem

The present invention relates to a method for producing polyamide acid particles including the steps of: preparing a solution having a diamine compound dissolved; and precipitating polyamide acid particles by adding a tetracarboxylic anhydride in a non-solution state to the solution having a diamine compound dissolved while applying a physical impact thereto. The present invention also relates to a bonding material for an electronic component, which contains a curable compound, a curing agent, and polyimide particles having an average particle diameter of 0.03 to 3 µm and a CV value of particle diameter of 10 to 50%.

The present invention is described in details below.

The present inventor has found that polyamide acid particles used as a raw material for polyimide particles having a small average particle diameter and high heat resistance can be produced by a method for producing polyamide acid particles including the steps of preparing a solution having a diamine compound dissolved and of adding a tetracarboxylic anhydride in a non-solution state to the solution having a diamine compound dissolved while applying a physical impact so as to precipitate polyamide acid particles.

The present inventor has also found that a bonding material for an electronic component in which polyimide particles which are obtained by imidizing polyamide acid particles obtained by the method for producing polyamide acid particles are incorporated has a low linear expansion coefficient and a low elastic modulus after being cured in the temperature range equal to or less than the glass transition temperature, so that a joined body with high reliability can be produced. The present inventor has further found that the CV value of particle diameter is critical to obtaining such a joined body with high reliability, in addition to the small particle diameter of the polyimide particles with a large surface area in the bonding material for an electronic component. More specifically, the bonding material for an electronic component has poor coating properties and film-forming capability due to reduced flowability, when densely filled with polyimide particles only having a small average particle diameter to the extent of sufficiently reducing the linear expansion coefficient and the elastic modulus after being cured in the temperature range equal to or less than the glass transition temperature.

The present inventor has found that a bonding material for an electronic component can be densely filled with polyimide particles with suppressing reduction in flowability, using polyimide particles having an average particle diameter of 0.03 to 3 μm and a CV value of particle diameter of 10 to 50%. Consequently the bonding material for an electronic component has a low linear expansion coefficient and a low elastic modulus after being cured in the temperature range equal to or less than the glass transition temperature, so that a joined body with high reliability can be produced, thereby completing the present invention.

To begin with, a method for producing polyamide acid particles, a method for producing polyimide particles using the method for producing polyamide acid particles, and polyimide particles produced by the method for producing polyimide particles each according to the present invention are described.

A method for producing polyamide acid particles of the present invention includes a first step of preparing a solution having a diamine compound dissolved.

The diamine compound is not specifically limited. Examples include aromatic diamine, aliphatic diamine, and alicyclic diamine. Among them, aromatic diamine is preferable, because polyamide acid produced in a step to be described has a rigid structure. These diamine compounds may be used singly, or two or more thereof may be used in combination.

Examples of the aromatic diamine includes 1,4-phenylenediamine (PPD), 1,3-phenylenediamine, 1,2-phenylenediamine, 5-amino-2-(p-aminophenyl)benzoxazole (DAMBO), 4,4'-diaminodiphenyl ether (DPE), 3,4'-diaminodiphenyl ether, 4,4'-diaminodiphenylmethane (DDM), 4,4'-bis(4-aminophenoxy)biphenyl (BAPB), 1,4'-bis(4-aminophenoxy)benzene (TPE-Q), 1,3'-bis(4-aminophenoxy)benzene (TPE-R), 4,4'-diaminodiphenyl sulfone, 3,4-diaminodiphenyl sulfone, 3,3'-diaminodiphenyl sulfone, 4,4'-methylene-bis(2-chloroaniline), 3,3'-dimethyl-4,4'-diaminobiphenyl, 4,4'-diaminodiphenyl sulfide, 2,6'-diaminotoluene, 2,4-diaminochlorobenzene, 1,2-diaminoanthraquinone, 1,4-diaminoanthraquinone, 3,3'-diaminobenzophenone, 3,4-diaminobenzophenone, 4,4'-diaminobenzophenone, 4,4'-diaminobibenzyl, R(+)-2,2'-diamino-1,1'-binaphthalene, S(+)-2,2'-diamino-1,1'-binaphthalene, and 3,4-diaminopyridine.

Examples of the aliphatic diamine include 1,2-diamino methane, 1,4-diaminobutane, tetramethylene diamine, 1,10-diaminododecane, and 1,4-diamino-2-butanone.

Examples of the alicyclic diamine include 1,4-diaminocyclohexane, 1,2-diaminocyclohexane, bis(4-aminocyclohexyl)methane, and 4,4'-diamino dicyclohexylmethane.

A solvent for dissolving the diamine compound has a boiling point of preferably lower than 150° C. After production of the polyamide acid particles, the solvent having a boiling point of lower than 150° C. contained in the polyamide acid particles can be easily removed without a treatment at high temperature for a long period. In the case where the polyamide acid particles or the polyimide particles obtained by imidizing the polyamide acid particles are incorporated in a bonding material for an electronic component, generation of voids due to the remaining solvent can be thereby substantially reduced.

Examples of the solvent for dissolving the diamine compounds include acetone, methyl ethyl ketone (MEK), tetrahydrofuran (THF), ethyl acetate, toluene, xylene, N,N-dimethylformamide (DMF), dimethyl sulfoxide (DMSO), N,N-dimethylacetamide, N-methyl-2-pyrrolidone, 2-propanone, 3-pentanone, tetrahydropyrene, epichlorohydrin, acetanilide, methanol, ethanol, and isopropanol. These solvents for dissolving the diamine compound may be used singly, or two or more thereof may be used in combination for adjusting the solubility of the diamine compound and the solubility of polyamide acid produced in a step to be described.

Although the content of the diamine compound in the solution having the diamine compound dissolved is not specifically limited, a preferable lower limit is 0.001 mol/L, and a preferable upper limit is 0.20 mol/L. A diamine compound content of less than 0.001 mol/L may cause insufficient or inefficient progress in reaction of the diamine compound and a tetracarboxylic anhydride in a step to be described. A diamine compound content of more than 0.20 mol/L may cause unsuccessful precipitation of polyamide acid particles in a particulate form when the polyamide acid particles are precipitated in a step to be described.

The content of the diamine compound in the solution having the diamine compound has a more preferable lower limit of 0.01 mol/L, and a more preferable upper limit of 0.10 mol/L.

The method for producing polyamide acid particles of the present invention includes a second step of precipitating polyamide acid particles by adding a tetracarboxylic anhydride in a non-solution state to the solution having the diamine compound dissolved while applying a physical impact thereto (herein referred to as a step of precipitating polyamide acid particles).

In this step, the diamine compound and the tetracarboxylic anhydride react to produce polyamide acid having an amide bond and a carboxyl group as precipitation particles.

In order to precipitate the produced polyamide acid as particles, the solvent for dissolving the diamine compound needs to be capable of dissolving the diamine compound but not dissolving the produced polyamide acid. The solvents for dissolving the diamine compound described above have such properties.

As used herein, the term "dissolving the diamine compound but not dissolving the produced polyamide acid" means that during progress of reaction of the diamine compound and the tetracarboxylic anhydride, polyamide acid which has properties such as surface polarity and molecular weight thoroughly different from those of the diamine compound is produced and becomes insoluble to the solvent of the dissolved diamine compound.

As used herein, the term "addition of a tetracarboxylic anhydride in a non-solution state" means that the tetracarboxylic anhydride is directly added without dissolving it in a solvent. In contrast to the addition of a solution having the tetracarboxylic anhydride dissolved, the direct addition of the tetracarboxylic anhydride without dissolution in a solvent can suppress deactivation of the tetracarboxylic anhydride due to contact with atmospheric moisture during dissolution in the solvent or due to moisture in the solvent. Consequently polyamide acid particles with high degree of polymerization can be precipitated. Such polyamide acid particles are imidized, so that polyimide particles which are hardly decomposed even at high temperature so as to achieve high heat resistance can be produced. In addition, the content of residual monomers (the unreacted diamine compound and tetracarboxylic anhydride) and low molecular weight products can be reduced.

The tetracarboxylic anhydride for use in the method for producing polyamide acid particles of the present invention in a non-solution state is solid at normal temperature in many instances.

In order to precipitate the produced polyamide acid as particles, an application of a physical impact is also required during addition of the tetracarboxylic anhydride in a non-solution state to the solution having the diamine compound dissolved. The application of a physical impact is not specifically limited, including stirring, shaking, irradiation with ultrasonic waves, and treatment by a homogenizer or the like.

Among them, the solution having the diamine compound dissolved is irradiated with ultrasonic waves or vigorously stirred during addition of the tetracarboxylic anhydride in a non-solution state to the solution having the diamine compound dissolved, so that polyamide acid particles having a smaller average particle diameter can be precipitated. Specifically, ultrasonic irradiation to the solution having the diamine compound dissolved causes extremely fine vibration in the liquid so as to achieve high dispersion of the tetracarboxylic anhydride even in a non-solution state, so that polyamide acid particles having a smaller average particle diameter can be precipitated. In addition, the ultrasonic irradiation allows the reaction of the diamine compound and the tetracarboxylic anhydride to be accelerated while suppressing the reaction of the tetracarboxylic anhydride and the moisture in the solvent, so that the effect of increasing the degree of polymerization of the polyamide acid particles and the effect of reducing the contents of the residual monomers and the low molecular weight products are further enhanced.

The tetracarboxylic anhydride is not specifically limited, including aromatic tetracarboxylic anhydride, aliphatic tetracarboxylic anhydride, alicyclic tetracarboxylic anhydride, and heterocyclic tetracarboxylic anhydride. In particular, aromatic tetracarboxylic anhydride is preferable, producing polyamide acid having a rigid structure. These tetracarboxylic anhydrides may be used singly, or two or more thereof may be used in combination.

The aromatic tetracarboxylic anhydride is not specifically limited, including 4,4'-biphthalic anhydride (BPDA), pyromellitic anhydride (PMDA), 3,3',4,4'-benzophenone tetracarboxylic dianhydride (BTDA), 2,3,3',4'-biphenyl tetracarboxylic dianhydride, 1,3-bis(2,3-dicarboxy phenoxy) benzene dianhydride, 1,4-bis(2,3-dicarboxy phenoxy) benzene dianhydride, 2,3,3',4'-benzophenone tetracarboxylic dianhydride, 2,2',3,3'-benzophenone tetracarboxylic dianhydride, 2,2',3,3'-biphenyl tetracarboxylic dianhydride, 2,2',6, 6'-biphenyl tetracarboxylic dianhydride, naphthalene-1,2,4,5-tetracarboxylic dianhydride, anthracene-2,3,6,7-tetracarboxylic dianhydride, and phenanthrene-1,8,9,10-tetracarboxylic dianhydride.

Examples of the aliphatic tetracarboxylic anhydride include butane-1,2,3,4-tetracarboxylic dianhydride.

Examples of the alicyclic tetracarboxylic anhydride include cyclobutane-1,2,3,4-tetracarboxylic dianhydride.

Examples of the heterocyclic tetracarboxylic anhydride include thiophene-2,3,4,5-tetracarboxylic anhydride and pyridine-2,3,5,6-tetracarboxylic anhydride.

Although the addition amount of the tetracarboxylic anhydride is not specifically limited, a preferable lower limit is 0.5 mol and a preferable upper limit is 1.5 mol relative to 1 mol of the diamine compound. An addition amount of the tetracarboxylic anhydride of less than 0.5 mol may cause the increase of the content of the unreacted tetracarboxylic anhydride and the residues derived from the tetracarboxylic anhydride. An addition amount of the tetracarboxylic anhydride of more than 1.5 mol may cause the increase of the content of the unreacted diamine compound or the residues derived from the diamine compound contained in the polyamide acid particles as volatile matter.

The addition amount of the tetracarboxylic anhydride has a more preferable lower limit of 0.8 mol and a more preferable upper limit of 1.2 mol relative to 1 mol of the diamine compound.

The method for ultrasonic irradiating to the solution having the diamine compound dissolved is not specifically limited, including a method of ultrasonic irradiation by placing, in a bath of a ultrasonic device, a vessel containing the solution having the diamine compound dissolved, a method of ultrasonic irradiation by bringing an ultrasonic transducer into contact with a vessel containing the solution having the diamine compound dissolved and a method of ultrasonic irradiating the solution having the diamine compound dissolved with an ultrasonic transducer immersed therein. Among them, immersing an ultrasonic transducer in the solution having the diamine compound dissolved is preferable, because the vibration generated by an ultrasonic transducer is directly transmitted to reaction constituents without loss.

The conditions for the ultrasonic irradiation are not specifically limited, including conditions of 20 to 100 kHz, 20 to 2000 W, at 0 to 130° C. Examples of the ultrasonic device include conventionally known ultrasonic devices such as an ultrasonic oscillator, an ultrasonic homogenizer, and a tabletop ultrasonic cleaner.

In the method for producing polyamide acid particles of the present invention, another agitation method may be used in combination with the ultrasonic irradiation for stable precipitation of the polyamide acid particles.

The agitation method is not specifically limited, including agitation methods using, for example, a magnetic stirrer, a propeller agitator, a homogenizer, or a shaker.

In the method for producing polyamide acid particles of the present invention, a basic catalyst may also be used for the rapid progress of the reaction of the diamine compound and the tetracarboxylic anhydride.

The basic catalyst is not specifically limited, including a conventionally known basic catalysts such as pyridine, tertiary amine, diazabicycloundecene (DBU), and diazabicyclononene (DBN). These basic catalysts may be used singly, or two or more thereof may be used in combination.

In the method for producing polyamide acid particles of the present invention, the polyamide acid particles may be surface-treated. The method for surface-treating the polyamide acid particles is not specifically limited, including a method of previously dissolving a surface treatment agent in the solution having the diamine compound dissolved in the step of precipitating the polyamide acid particles.

The surface treatment agent is not specifically limited, including polyvinylpyrrolidone, polyvinyl alcohol, diethylene glycol dibenzoate, polytetramethylene oxide, celluloses such as carboxymethyl cellulose or hydroxypropyl methylcellulose, various types of starches, a silane coupling agent, and a titanate coupling agent. Using these surface treatment agents, the polyamide acid particles can be stably precipitated.

Although the addition amount of the surface treatment agent is not specifically limited, but preferably 0.01 to 20% by weight relative to the weight of polyamide acid particles to be precipitated, more preferably 0.1 to 10% by weight. An addition amount of less than 0.01% by weight may hardly produce the effect of the surface treatment agent. An addition amount of more than 10% by weight may produce no further effect.

According to the method for producing polyamide acid particles of the present invention, the polyamide acid particles having a small average particle diameter and a high degree of polymerization can be produced. Such polyamide acid particles are imidized to produce polyimide particles which are hardly decomposed even at high temperature to achieve high heat resistance. In addition, according to the method for producing polyamide acid particles of the present invention, the contents of residual monomers and low molecular weight products contained in the polyamide acid particles can be reduced.

The polyamide acid particles obtained by the method for producing polyamide acid particles of the present invention are imidized to produce polyimide particles. It is one aspect of the present invention to provide such a method for producing polyimide particles.

By the imidization, an amide bond and a carboxyl group of the polyamide acid particles react to form an imide bond, producing polyimide particles. The method for the imidization is not specifically limited, including a conventionally known method such as a method for imidization by thermal cyclization of the polyamide acid particles and a method for imidization by chemical cyclization of the polyamide acid particles.

Preferably the polyamide acid particles are stored in a dry state until being imidized. As used herein, the term "dry state" means a solid state, and is not necessarily meaning positive maintenance of the dry state using a drying agent or the like.

The method for imidization by thermal cyclization is not specifically limited, including a method of heating dispersed polyamide acid particles in an organic solvent with agitation at about 130 to 250° C. for about 1 to 10 hours.

In the method for imidization by thermal cyclization, water generated as a byproduct is preferably removed out of system with efficiency. Examples of the method for removing the water generated as a byproduct out of system include a method using a dry inert gas flow which allows the generated water to be removed out of system as vapor together with the dry inert gas and a method using an organic solvent azeotropic with water which allows the water to be removed out of system under reflux.

In the method for imidization by thermal cyclization, the amount of the polyamide acid particles to be dispersed in an organic solvent is not specifically limited and may be suitably adjusted, however, preferably with a lower limit of 1 g/L and an upper limit of 50 g/L, more preferably with a lower limit of 5 g/L and an upper limit of 10 g/L.

The method for imidization by chemical cyclization is not specifically limited, including a method of heating dispersed polyamide acid particles in a mixed organic solvent of pyridine and acetic anhydride with agitation at about 15 to 115° C. for about 24 hours.

In the method for producing polyimide particles of the present invention, the produced polyimide particles and an organic solvent can be separated and collected by a conventionally known method such as filtration, centrifugation, decantation, and vacuum drying or the like. The produced polyimide particles may also be washed with an organic solvent such as acetone, ethyl acetate, methyl ethyl ketone (MEK), ether, and alcohol, or the like on an as-needed basis.

In the method for producing polyimide particles of the present invention, the polyimide particles may be surface-treated. Examples of the surface treatment method for the polyimide particles include a method of performing a step of surface-treating the produced polyimide particles.

In incorporating the polyimide particles in a bonding material for an electronic component, the surface treatment of the produced polyimide particles allows the dispersion of the polyimide particles to be enhanced and the bonding material for an electronic component to be densely filled with the polyimide particles while preventing viscosity increase so as to ensure adequate flowability and wettability. Thus, the effect of addition of the polyimide particles to the bonding material for an electronic component is further enhanced.

The surface treatment method is not specifically limited, including a surface treatment method using a silane coupling agent.

The surface treatment method using a silane coupling agent is not specifically limited, including a method of reacting functional groups existing on the surface of the polyimide particles and the silane coupling agent, and a method of forming a coating layer on the surface of the polyimide particles and reacting functional groups existing on the surface of the coating layer and the silane coupling agent.

The method of forming the coating layer is not specifically limited, including a method of physical adsorption of polyvinyl alcohol.

Examples of the surface treatment method also include a method of physical contact of the polyimide particles and a surface treatment agent. More specifically, the polyimide particles may be blended with a solution of the surface treatment agent and agitated for a sufficient time. The surface treatment agent is not specifically limited, including polyvinyl pyrrolidone, polyvinyl alcohol, diethylene glycol dibenzoate, polytetramethylene oxide, celluloses such as carboxymethyl cellulose or hydroxypropyl methylcellulose, various types of starches, a silane coupling agent, and a titanate coupling agent.

Although the addition amount of the surface treatment agent is not specifically limited, but preferably 0.01 to 20% by weight relative to the weight of polyimide particles to be treated, more preferably 0.1 to 10% by weight. An addition amount of less than 0.01% by weight may hardly produce the effect of the surface treatment agent. An addition amount of more than 10% by weight may produce no further effect.

In addition, in the method for producing polyimide particles of the present invention, surface-treated polyimide particles can be obtained without the step of surface-treating of polyimide particles described above, by, for example, adding a compound having a specific functional group to the solution having the diamine compound dissolved, or using a compound having a specific functional group in a part of the diamine compound and/or the carboxylic anhydride.

For example, polyimide particles having an amino group on the surface can be obtained by adding a trivalent amine such as 2,4,6-triaminopyrimidine to the solution having the diamine compound dissolved. Furthermore, the surface of polyimide particles can be secondarily modified by the reaction of the amino group and a functional compound having a glycidyl group, a carboxyl group, an alkyl group, or the like.

According to the method for producing polyimide particles of the present invention, the polyimide particles having a small average particle diameter and a high degree of polymerization can be produced, due to the use of the polyamide acid particles obtained by the method for producing polyamide acid particles of the present invention as raw material. The polyimide particles are hardly decomposed even at high temperature, achieving high heat resistance due to the high degree of polymerization. In addition, according to the method for producing polyimide particles of the present invention, the content of residual monomers and low molecular weight products contained in the polyimide particles can be reduced.

The polyimide particles obtained by the method for producing polyimide particles of the present invention has high heat resistance and small content of residual monomers and low molecular weight products, achieving a small weight loss ratio after heating at high temperature.

It is also one aspect of the present invention to provide polyimide particles obtained by the method for producing polyimide particles of the present invention, which has a weight loss ratio of 5% or less after heating from 30° C. to 300° C. at a temperature increase rate of 10° C./min.

The polyimide particles of the present invention has a weight loss ratio of 5% or less after heating from 30° C. to 300° C. at a temperature increase rate of 10° C./min. The polyimide particles incorporated in a bonding material for an electronic component suppress decomposition of the polyimide particles under high temperature or generation of voids in the bonding material for an electronic component due to gas generation from polyimide particles, so that a joined body with high reliability can be produced.

As used herein, a weight loss ratio X (%) after heating from 30° C. to 300° C. at a temperature increase rate of 10° C./min means a value calculated from the following expression:

$$X=\{(A-B)/A\} \times 100 (\%)$$

wherein A represents the initial weight of polyimide particles which are heated from 30° C. to 300° C. at a temperature increase rate of 10° C./min, using a measurement device such as a thermogravimetric/differential thermal analyzer (TG/DTA), and B represents the weight of polyimide particles after being heated to 300° C.

The thermogravimetric/differential thermal analyzer (TG/DTA) is not specifically limited, including EXSTAR6000 made by SII NanoTechnology Inc.

The polyimide particles of the present invention have an average particle diameter preferably with a lower limit of 0.03 μm and preferably with an upper limit of 3 μm Polyimide particles having an average particle diameter of less than 0.03 μm incorporated in a bonding material for an electronic component may produce insufficient effect of reducing linear expansion coefficient of the cured bonding material for an electronic component, or may cause significantly poor coating properties and film-forming capability due to reduced flowability of the bonding material for an electronic component when an increased amount is incorporated. Polyimide particles having an average particle diameter of more than 3 μm incorporated in a bonding material for an electronic component may form foreign substances in the bonding material for an electronic component, may cause pinching of polyimide particles during joining of the semiconductor chips, or may prevent the bonding material for an electronic component from being thinned.

The polyimide particles of the present invention have an average particle diameter more preferably with an upper limit of 1 μm.

The polyimide particles of the present invention have a CV value of particle diameter preferably with a lower limit of 12% and preferably with an upper limit of 50%. Polyimide particles having a CV value of particle diameter of less than 12% incorporated in a bonding material for an electronic component may cause difficulty in dense filling of the bonding material for an electronic component with the polyimide particles without combination of other polyimide particles, or may cause significantly poor coating properties and film-forming capability due to reduced flowability of the bonding material for an electronic component when an increased amount is incorporated. With a CV value of particle diameter of more than 50%, abnormally large particles or abnormally small particles may be included.

The polyimide particles of the present invention have a CV value of particle diameter, more preferably with an upper limit of 40%.

As used herein, the term "average particle diameter of polyimide particles" means a number average value calculated from the particle diameter of any 50 or more polyimide particles which are arbitrarily selected from an SEM picture through observation of polyimide particles by a scanning electron microscope (SEM). As used herein, the term "CV value of particle diameter of polyimide particles" means a value calculated from the following expression:

$$CV \text{ value } (\%) = \sigma/m \times 100$$

wherein m represents the average particle diameter of polyimide particles, and σ represents standard deviation.

The use of the polyimide particles of the present invention is not specifically limited, including a filler for a plastic molded article required to have heat resistance and strength, and a filler for a bonding material for an electronic component. Among them, the polyimide particles of the present invention are preferably used as a filler for a bonding material for an electronic component. The polyimide particles incorporated in a bonding material for an electronic component allow the high-temperature elastic modulus of the cured bonding material for an electronic component to be enhanced without excessive enhancement of the elastic modulus in a low to normal temperature range, and also allow the linear expansion coefficient to be sufficiently reduced.

Furthermore, the polyimide particles of the present invention are most preferably used as a filler for a bonding material for flip-chip mounting. In flip-chip mounting, a step of joining an electrode is performed at a temperature of about 200 to 300° C. The polyimide particles of the present invention incorporated in a bonding material for flip-chip mounting can suppress decomposition of the polyimide particles under high temperature or generation of voids in the bonding material for flip-chip mounting due to gas generation from polyimide particles.

A bonding material for an electronic component of the present invention is described below.

A bonding material for an electronic component of the present invention contains a curable compound.

The curable compound is not specifically limited, including a compound which is cured by a reaction such as addition polymerization, condensation polymerization, polyaddition, addition condensation, and ring-opening polymerization. Examples of the curable compound include a thermosetting compound such as a urea resin, a melamine resin, a phenol resin, a resorcinol resin, an epoxy resin, an acrylic resin, a polyester resin, a polyamide resin, a polybenzimidazole resin, a diallyl phthalate resin, a xylene resin, an alkyl benzene resin, an epoxy acrylate resin, a silicone resin, and a urethane resin. Among them, an epoxy resin is preferable, producing a joined body having excellent reliability and bonding strength.

The epoxy resin described above is not specifically limited, including a bisphenol type epoxy resin such as a bisphenol A type epoxy resin, a bisphenol F type epoxy resin, a bisphenol AD type epoxy resin, and a bisphenol S type epoxy resin; a novolac type epoxy resin such as a phenol novolac type epoxy resin and a cresol novolac type epoxy resin; an aromatic epoxy resin such as tris-phenol methane triglycidyl ether; a naphthalene type epoxy resin; a fluorene type epoxy resin; a dicyclopentadiene type epoxy resin; and a denatured product and a hydrogenated product thereof. These epoxy resins may be used singly, or two or more thereof may be used in combination.

In the case where the epoxy resin is used as the curable compound, the curable compound may further contain a polymer compound having a functional group reactive to the epoxy resin.

The inclusion of the polymer compound having a functional group reactive to the epoxy resin allows a produced bonding material for an electronic component to have toughness, exhibiting excellent impact resistance.

The polymer compound having a functional group reactive to the epoxy resin is not specifically limited, including a polymer compound having, for example, an amino group, a urethane group, an imide group, a hydroxyl group, a carboxyl group, and an epoxy group. Among them, a polymer compound having an epoxy group is preferable.

In the case where an epoxy resin and a polymer compound having an epoxy group are used as the curable compound, the cured bonding material for an electronic component to be produced has excellent mechanical strength, heat resistance, and moisture resistance derived from the epoxy resin and also has excellent toughness derived from the polymer compound having an epoxy group, enabling exhibiting high bonding reliability and high conduction reliability.

The polymer compound having an epoxy group is required to have an epoxy group at a terminal and/or side chain (pendant position) but not specifically limited, including an epoxy group-containing acrylic rubber, an epoxy group-containing butadiene rubber, a bisphenol-type high molecular weight epoxy resin, an epoxy group-containing phenoxy resin, an epoxy group-containing acrylic resin, an epoxy group-containing urethane resin, and an epoxy group-containing polyester resin. Among them, an epoxy group-containing acrylic resin is preferable, because it contains a large amount of epoxy groups and allows a cured bonding material for an electronic component with excellent mechanical strength, heat resistance, or the like to be produced. These polymer compounds having an epoxy group may be used singly, or two or more thereof may be used in combination.

In the case of using the polymer compound having an epoxy group, especially the epoxy group-containing acrylic resin, as the polymer compound having a functional group reactive to the epoxy resin, the preferable lower limit of a weight average molecular weight is 10,000. A weight average molecular weight of less than 10,000 may cause difficulty in holding a shape due to insufficient film formability as a bonding material for an electronic component in a sheet form.

In the case of using the polymer compound having an epoxy group, especially the epoxy group-containing acrylic resin, as the polymer compound having a functional group reactive to the epoxy resin, the preferable lower limit of an epoxy equivalent is 200 and the preferable upper limit is 1,000. An epoxy equivalent of less than 200 may produce a hard and brittle cured bonding material for an electronic component. An epoxy equivalent of more than 1,000 may produce a cured bonding material for an electronic component having insufficient mechanical strength and heat resistance.

The content of the polymer compound having a functional group reactive to the epoxy resin is not specifically limited, preferably with a lower limit of 1 part by weight relative to 100 parts by weight of the epoxy resin, and preferably with an upper limit of 500 parts by weight. A content of the polymer compound having a functional group reactive to the epoxy resin of less than 1 part by weight may produce a bonding material for an electronic component having poor bonding reliability due to insufficient toughness against thermal strain if generated. A content of the polymer compound having a functional group reactive to the epoxy resin of more than 500 parts by weight may produce a cured bonding material for an electronic component having reduced heat resistance.

The bonding material for an electronic component of the present invention contains a curing agent.

The curing agent is not specifically limited, including an amine curing agent, an acid anhydride curing agent, and a phenol curing agent. Among them, an acid anhydride curing agent is preferable.

Although the acid anhydride curing agent is not specifically limited, a bifunctional acid anhydride curing agent is preferable. The bifunctional acid anhydride curing agent is not specifically limited, including phthalic anhydride, hexahydrophthalic anhydride, methyl tetrahydrophthalic anhydride, methyl hexahydrophthalic anhydride, endo-methylene tetrahydrophthalic anhydride, methyl endo-methylene tetrahydrophthalic anhydride, and maleic anhydride.

Curing agent particles of tri- or more-functional acid anhydride may also be used as the acid anhydride curing agent. The curing agent particles of tri- or more-functional acid anhydride are not specifically limited, including particles of tri-functional acid anhydride such as trimellitic anhydride, and particles of tetra- or more-functional acid anhydride such as pyromellitic anhydride, benzophenone tetracarboxylic anhydride, methylcyclohexene tetracarboxylic anhydride, and polyazelaic anhydride.

The average particle diameter of the curing agent particles of tri- or more-functional acid anhydride is not specifically limited, preferably with a lower limit of 0.1 µm, and preferably with an upper limit of 20 µm. An average particle diameter of curing agent particles of less than 0.1 µm may increase the viscosity of the bonding material for an electronic component to be produced due to aggregation of the curing agent particles. An average particle diameter of the curing agent particles of more than 20 µm may cause curing failure due to insufficient diffusion of the curing agent particles during curing.

The content of the curing agent is not specifically limited, preferably with a lower limit of 5 parts by weight relative to 100 parts by weight of the curable compound, and preferably with an upper limit of 150 parts by weight. A content of the curing agent of less than 5 parts by weight may produce insufficiently cured bonding material for an electronic component. A content of the curing agent of more than 150 parts by weight may reduce the bonding reliability of the bonding material for an electronic component.

The content of the curing agent has a more preferable lower limit of 10 parts by weight relative to 100 parts by weight of the curable compound, and a more preferable upper limit of 140 parts by weight.

In the case where the curing agent contains the bifunctional acid anhydride curing agent and the curing agent particles of tri- or more-functional acid anhydride, the incorporation ratio of these is not specifically limited, preferably with a lower limit of the quotient of the content (weight) of the curing agent particles of tri- or more-functional acid anhydride divided by the content (weight) of the bifunctional acid anhydride curing agent[=(content of curing agent particles of tri- or more-functional acid anhydride)/(content of bifunctional acid anhydride curing agent)] of 0.1 and preferably with an upper limit of 10. The quotient less than 0.1 may produce insufficient effect of adding the curing agent particles of tri- or more-functional acid anhydride. The quotient more than 10 may produce a brittle cured bonding material for an electronic component, resulting in insufficient bonding reliability.

The quotient has a more preferable lower limit of 0.2 and a more preferable upper limit of 8.

Preferably the bonding material for an electronic component of the present invention contains a curing accelerator.

The curing accelerator is not specifically limited, including an imidazole curing accelerator and a tertiary amine curing accelerator. Among them, an imidazole curing accelerator is preferable due to easy control of a reaction system for adjusting a curing rate and physical properties of cured material. These curing accelerators may be used singly, or two or more thereof may be used in combination.

The imidazole curing accelerator is not specifically limited, including 1-cyanoethyl-2-phenylimidazole obtained by protecting the first position of the imidazole with a cyanoethyl group, and an imidazole curing accelerator (trade name "2MA-OK" made by Shikoku Chemicals Corporation) obtained by protecting basicity with isocyanuric acid. These imidazole curing accelerators may be used singly, or two or more thereof may be used in combination.

The content of the curing accelerator is not specifically limited, preferably with a lower limit of 1 part by weight relative to 100 parts by weight of the curable compound, and preferably with an upper limit of 20 parts by weight. A content of the curing accelerator of less than 1 part by weight may produce an insufficiently cured bonding material for an electronic component. A content of the curing accelerator of more than 20 parts by weight may produce a bonding material for an electronic component with reduced bonding reliability.

The bonding material for an electronic component of the present invention contains polyimide particles.

The addition of the polyimide particles reduces the linear expansion coefficient of the bonding material for an electronic component after being cured in the temperature range equal to or less than the glass transition temperature without addition of an inorganic filler or the like. Furthermore, in contrast with an inorganic filler having effects of reducing the linear expansion coefficient but increasing the elastic modulus, the polyimide particles can reduce the linear expansion coefficient while suppressing the increase of the elastic modulus.

The polyimide particles have an average particle diameter of 0.03 to 3 μm and a CV value of particle diameter of 10 to 50%. The polyimide particles having the average particle diameter and the CV value of particle diameter in such a range are regarded to have a sufficiently small average particle diameter and an adequate particle diameter distribution.

Due to the sufficiently small average particle diameter of the polyimide particles and the large surface area of the polyimide particles in the bonding material for an electronic component of the present invention, the bonding material for an electronic component of the present invention has a sufficiently low linear expansion coefficient and elastic modulus after being cured in the temperature range equal to or less than the glass transition temperature, enabling production of a joined body with high reliability. In addition, since the polyimide particles have an adequate particle diameter distribution, the bonding material for an electronic component of the present invention allows the polyimide particles having a small particle diameter to enter the gaps among the polyimide particles having a large particle diameter. Consequently, the bonding material can be densely filled with the polyimide particles and the reduction in flowability can be more suppressed compared to the case with a CV value of the particle diameter out of the range.

A bonding material for an electronic component has significantly poor coating properties and film-forming capability due to reduced flowability, when densely filled with polyimide particles having an average particle diameter of less than 0.03 μm to the extent of sufficiently reducing the linear expansion coefficient after being cured in the temperature range equal to or less than the glass transition temperature. Polyimide particles having an average particle diameter of more than 3 μm produce insufficient effect of reducing the linear expansion coefficient after being cured in the temperature range equal to or less than the glass transition temperature. Also, these polyimide particles form foreign substances in the bonding material for an electronic component during bonding of downsized and thinned semiconductor chips, and cause pinching of polyimide particles during joining of the semiconductor chips. Further, these polyimide particles prevent the bonding material for an electronic component from being thinned.

The polyimide particles have an average particle diameter, preferably with a lower limit of 0.05 μm, and preferably with an upper limit of 1 μm.

A CV value of the particle diameter of less than 10% may cause difficulty in dense filling with the polyimide particles while suppressing reduction in the flowability of the bonding material for an electronic component. Even in the case where dense filling is achieved, the use as a bonding material for an electronic component in a sheet form causes difficulty in making an excellent sheet due to roughening of the surface. With a CV value of the particle diameter of more than 50%, abnormally large particles or abnormally small particles are included and therefore reduction in coating properties and film-forming capability may be caused due to reduced flowability of the bonding material for an electronic component.

The polyimide particles have a CV value of the particle diameter, preferably with a lower limit of 15%, and preferably with an upper limit of 40%.

The polyimide compound contained in the polyimide particles is not specifically limited, preferably including a polyimide compound having a main backbone with an aromatic ring.

The polyimide compound, due to having a main backbone with an aromatic ring, has a more rigid and less fluctuating molecular structure, so that the linear expansion coefficient of the bonding material for an electronic component after being cured in the temperature range equal to or less than the glass transition temperature can be further reduced.

The polyimide compound having a main backbone with an aromatic ring is not specifically limited, preferably including a polyimide compound having a main backbone with a benzoxazole structure.

Examples of the polyimide compound having a main backbone with an aromatic ring also include, for example, a polyimide compound having a main backbone with an aromatic ring such as phenyl, biphenyl, and naphthalene, or more specifically, for example, poly(N,N'-p-phenylene-biphenyl tetracarboxylimide).

A method for producing the polyimide particles is not specifically limited, preferably including a method of manufacturing polyamide acid particles by reaction of a tetracarboxylic anhydride and a diamine compound and imidizing the produced polyamide acid particles to produce polyimide particles.

Examples of the method for producing the polyamide acid particles include, in addition to the method for producing polyamide acid particles of the present invention, a method of forming precipitates of polyamide acid particles by separately preparing a solution having tetracarboxylic anhydride dissolved and a solution having diamine compound dissolved and mixing the two solutions, and a method of forming precipitates of polyamide acid particles by dripping the mixed solution of the two solutions into a poor solvent of polyamide acid.

In these methods, the solution having tetracarboxylic anhydride dissolved, the solution having diamine compound dissolved, or the poor solvent for polyamide acid is irradiated with ultrasonic waves or vigorously agitated when polyamide acid particles are precipitated, so that polyamide acid particles having a smaller average particle diameter can be precipitated. The agitation method is not specifically limited, including methods using a magnetic stirrer, a propeller stirrer, homogenizer, and shaker.

A method for producing polyimide particles described below is also available. The method includes a step of preparing a polyamide acid varnish, and a step of heating the produced polyamide acid varnish. In the step of preparing a polyamide acid varnish, a reaction of a tetracarboxylic anhydride and a diamine mixture is conducted. Here, the diamine mixture is composed of a diamine compound which can form an imide structure soluble in reaction solvent, a diamine compound which can form an imide structure insoluble in reaction solvent, and a diamine compound which can form an imide structure having a functional group such as an amino group. In the step of heating, the produced polyamide acid varnish is heated to form precipitates of polyimide particles in the reaction solvent.

According to this method, polyimide particles having a desired average particle diameter can be produced by adjusting the incorporation ratio of the diamine compounds in the diamine mixture.

Among them, the method for producing polyamide acid particles and the method for producing polyimide particles of the present invention are preferable, since polyimide particles having a small average particle diameter and high heat resistance can be produced by a relatively simple method. On an as-needed basis, the produced polyimide particles are heat-treated at a high temperature of about 300° C., so as to further enhance the heat resistance.

Even in a method other than the method for producing polyamide acid particles and the method for producing polyimide particles of the present invention, polyimide particles having high heat resistance can be produced by heat-treating the produced polyimide particles at a high temperature of about 300° C.

The tetracarboxylic anhydride is not specifically limited, including aromatic tetracarboxylic anhydride, aliphatic tetracarboxylic anhydride, alicyclic tetracarboxylic anhydride, and heterocyclic tetracarboxylic anhydride, which are used in the method for producing polyamide acid particles and the method for producing polyimide particles of the present invention.

The diamine compound is not specifically limited, including aromatic diamine, aliphatic diamine, and alicyclic diamine which are used in the method for producing polyamide acid particles and the method for producing polyimide particles of the present invention. In the case where the polyimide particles contain a polyimide compound having a main backbone with a benzoxazole structure, preferably the aromatic diamine has a benzoxazole structure.

The aromatic diamine having a benzoxazole structure is not specifically limited, including 5-amino-2-(p-aminophenyl)benzoxazole, 6-amino-2-(p-aminophenyl)benzoxazole, 5-amino-2-(m-aminophenyl)benzoxazole, 6-amino-2-(m-aminophenyl)benzoxazole, 2,2'-p-phenylene bis(5-aminobenzoxazole), 2,2'-p-phenylene bis(6-aminobenzoxazole), 1-(5-aminobenzoxazolo)-4-(6-aminobenzoxazolo)benzene, 2,6-(4,4'-diaminodiphenyl)benzo[1,2-d:5,4-d']bisoxazole, 2,6-(4,4'-diaminodiphenyl)benzo[1,2-d:4,5-d']bisoxazole, 2,6-(3,4'-diaminodiphenyl)benzo[1,2-d:5,4-d']bisoxazole, 2,6-(3,4'-diaminodiphenyl)benzo[1,2-d:4,5-d']bisoxazole, 2,6-(3,3'-diaminodiphenyl)benzo[1,2-d:5,4-d']bisoxazole, 2,6-(3,3'-diaminodiphenyl)benzo[1,2-d:4,5-d']bisoxazole.

Of these aromatic diamines having a benzoxazole structure, each of the isomers of amino(aminophenyl)benzoxazole is preferable due to the easiness of synthesis, and 5-amino-2-(p-aminophenyl)benzoxazole is more preferable.

As used herein, the term "each of the isomers of amino(aminophenyl)benzoxazole" means each of the isomers distinguished by the positions of two amino groups of amino(aminophenyl)benzoxazole, including 5-amino-2-(p-aminophenyl)benzoxazole, 6-amino-2-(p-aminophenyl)benzoxazole, 5-amino-2-(m-aminophenyl)benzoxazole, and 6-amino-2-(m-aminophenyl)benzoxazole.

These aromatic diamines having a benzoxazole structure may be used singly, or two or more thereof may be used in combination.

Preferably the polyimide particles are surface-treated by, for example, in a same method as a method for the polyimide particles of the present invention.

The surface treatment of the polyimide particles allows for dense filling with the polyimide particles while further suppressing the reduction in the flowability of the bonding material for an electronic component.

Preferably the polyimide particles have a weight loss ratio of 5% or less after heating from 30° C. to 300° C. at a temperature increase rate of 10° C./min. With a weight loss ratio of 5% or less, the decomposition of the polyimide particles under high temperature or generation of voids in the bonding material for an electronic component due to gas generation from polyimide particles are prevented, so that a joined body with high reliability can be produced.

The content of the polyimide particles is not specifically limited, with a preferable lower limit of 5 parts by weight relative to 100 parts by weight of the curable compound, and with a preferable upper limit of 900 parts by weight. A content of the polyimide particles of less than 5 parts by weight may produce insufficient effect of reducing the linear expansion coefficient after being cured in a temperature range equal to or less than glass transition temperature. A content of the polyimide particles of more than 900 parts by weight may cause poor coating properties and film-forming capability due to reduced flowability of the bonding material for an electronic component.

The preferable lower limit of the content of the polyimide particles is 30 parts by weight relative to 100 parts by weight of the curable compound, and the preferable upper limit is 700 parts by weight. The more preferable lower limit is 50 parts by weight, and the more preferable upper limit is 500 parts by weight.

The bonding material for an electronic component of the present invention may contain an inorganic filler within the bounds of not inhibiting the effect of the present invention, or within the bounds of further reducing the linear expansion coefficient after being cured in the temperature range equal to or less than the glass transition temperature and not increasing the elastic modulus.

The inorganic filler is not specifically limited, including silica such as fumed silica and colloidal silica, glass fiber, and alumina particles.

A granular inorganic filler for use as the inorganic filler has an average particle diameter with a preferable lower limit of 0.1 nm, and a preferable upper limit of 30 µm. An average particle diameter of the granular inorganic filler less than 0.1 nm may cause poor coating properties and film-forming capability due to reduced flowability of the bonding material for an electronic component. An average particle diameter of the granular inorganic filler more than 30 μm may cause pinching of the inorganic filler during joining of the downsized and thinned semiconductor chips.

The content of the inorganic filler is not specifically limited, with a preferable lower limit of 5 parts by weight relative to 100 parts by weight of the curable compound, and with a preferable upper limit of 100 parts by weight. A content of the inorganic filler of less than 5 parts by weight may hardly produce effect of adding the inorganic filler. A content of the inorganic filler of more than 100 parts by weight may reduce the linear expansion coefficient of the bonding material for an electronic component after being cured in the temperature range equal to or less than the glass transition temperature but increase the elastic modulus.

The more preferable upper limit of the content of the inorganic filler is 50 parts by weight relative to 100 parts by weight of the curable compound.

The bonding material for an electronic component of the present invention may contain a dilution agent within the bounds of not inhibiting the effect of the present invention.

The dilution agent is not specifically limited, preferably including a reactive dilution agent to be taken in a cured material when the bonding material for an electronic component is heat-cured. Among them, a reactive dilution agent having 2 or more functional groups in a molecule is preferable, for not impairing bonding reliability of the bonding material for an electronic component to be produced.

Examples of the reactive dilution agent having 2 or more functional groups in a molecule include, for example, aliphatic-type epoxy, ethylene oxide-modified epoxy, propylene oxide-modified epoxy, cyclohexane-type epoxy, dicyclopentadiene-type epoxy, and phenol-type epoxy.

The content of the dilution agent is not specifically limited, with a preferable lower limit of 1 part by weight relative to 100 parts by weight of the curable compound, and with a preferable upper limit of 50 parts by weight. A content of the dilution agent of less than 1 part by weight may hardly produce the effect of adding the dilution agent. A content of the dilution agent of more than 50 parts by weight may cause poor bonding reliability of the produced bonding material for an electronic component, or may not achieve the viscosity characteristics described below.

The more preferable lower limit of the content of the dilution agent is 5 parts by weight relative to 100 parts by weight of the curable compound, and the more preferable upper limit is 20 parts by weight.

The bonding material for an electronic component of the present invention may contain a solvent on an as-needed basis.

The solvent is not specifically limited, including aromatic hydrocarbons, aromatic hydrocarbon chlorides, aliphatic hydrocarbon chloride, alcohols, esters, ethers, ketones, glycol ethers (cellosolve), alicyclic hydrocarbons, and aliphatic hydrocarbons.

The bonding material for an electronic component of the present invention may contain an inorganic ion exchanger on an as-needed basis. Examples of the inorganic ion exchanger commercially available include IXE series (made by Toagosei Co., Ltd).

The content of the inorganic ion exchanger is not specifically limited, with a preferable lower limit of 1% by weight, and with a preferable upper limit of 10% by weight.

The bonding material for an electronic component of the present invention may contain an additive including a bleeding preventing agent and a tackifier such as an imidazole silane coupling agent on an as-needed basis.

The bonding material for an electronic component of the present invention has a viscosity measured by an E-type viscometer under the condition of 0.5 rpm at 25° C., with a preferable lower limit of 20 Pa·s, and with a preferable upper limit of 1000 Pa·s. The bonding material for an electronic component having a viscosity of less than 20 Pa·s may have insufficient shape holding properties. The bonding material for an electronic component having a viscosity of more than 1000 Pa·s may have poor coating properties and film-forming capability, resulting in, for example, lack of discharging stability when applied with an air dispenser.

The bonding material for an electronic component of the present invention has a linear expansion coefficient after being cured in the temperature range equal to or less than the glass transition temperature, with a preferable lower limit of 10 ppm and with a preferable upper limit of 60 ppm. The bonding material for an electronic component having a linear expansion coefficient of less than 10 ppm, which is lower than that of a solder or a substrate, may cause detachment of a semiconductor chip due to stress concentration at a joint portion resulting from thermal expansion of the solder or the substrate. A linear expansion coefficient of more than 60 ppm may easily cause a crack in a conducting portion of solder or the like due to the increased stress to a bonded semiconductor chip resulting from thermal strain.

A more preferable lower limit of the linear expansion coefficient is 15 ppm, and a more preferable upper limit is 55 ppm.

The bonding material for an electronic component of the present invention has a linear expansion coefficient after being cured in the temperature range above the glass transition temperature, with a preferable lower limit of 50 ppm and with a preferable upper limit of 140 ppm. The more preferable lower limit of the linear expansion coefficient is 60 ppm, and the more preferable upper limit is 130 ppm.

As used herein, the linear expansion coefficient after being cured of a bonding material for an electronic component is a value calculated from the slope of an SS curve obtained by the following steps. That is, a bonding material for an electronic component is cured at 110° C. for 40 minutes and further at 170° C. for 30 minutes to form a cured material having a thickness of 500 μm. Then, a temperature is raised to 300° C. with conditions below: a load is 2 N, a temperature increase rate is 5° C./rain, and a sample length is 1 cm. Here, a thermal stress/strain measurement instrument ("EXTEAR TMA/SS 6100" made by SII NanoTechnology Inc.) is used.

The bonding material for an electronic component of the present invention has an elastic modulus after being cured in a temperature range of 25 to 170° C., with a preferable lower limit of 10 MPa and with a preferable upper limit of 7000 MPa. The cured bonding material for an electronic component having an elastic modulus of less than 10 MPa may have insufficient heat resistance. An elastic modulus of more than 7000 MPa may easily cause a crack in a conducting portion of solder or the like due to the increased stress to a bonded semiconductor chip resulting from thermal strain.

The more preferable lower limit of the elastic modulus is 50 MPa, the more preferable upper limit is 6000 MPa, and the furthermore preferable upper limit is 5000 MPa.

As used herein, the elastic modulus after being cured of a bonding material for an electronic component is a value obtained by curing a bonding material for an electronic component at 110° C. for 40 minutes and further curing at 170° C. for 30 minutes to form a cured material with a thickness of 500 μm, and raising temperature to 300° C. at a temperature increase rate of 5° C./min, with a grip width for pulling of 24 mm, at 10 Hz, using a viscoelasticity measurement instrument (type "DVA-200" made by IT Measurement Co., Ltd).

The shape of the bonding material for an electronic component of the present invention is not specifically limited, including a paste form and a sheet form.

The method for producing the bonding material for an electronic component of the present invention is not specifically limited. Examples of the method for producing the bonding material in a paste form for an electronic component of the present invention include, for example, a method of incorporating predetermined amounts of the curable compound, the curing agent, the polyimide particles, and other additives to be added on an as-needed basis and mixing them according to a conventionally known method.

Examples of the method for producing the bonding material in a sheet form for an electronic component of the present invention include, for example, a method of extrusion-molding a bonding material in a paste form for an electronic component into a sheet form, and a method of shaping a sheet form from a solution containing a bonding material in a paste form for an electronic component by using a solution casting method, a spin coating method in which a wafer is directly coated, a screen printing method, or the like.

Advantageous Effects of Invention

According to the present invention, a method for producing polyamide acid particles which is used as a raw material for polyimide particles with a small average particle diameter having high heat resistance is provided. Also, according to the present invention, a method for producing polyimide particles using the method for producing polyamide acid particles, and polyimide particles produced by the method for producing polyimide particles are provided. Further, according to the present invention, a bonding material for an electronic component is provided, which has a low linear expansion coefficient and a low elastic modulus after being cured in the temperature range equal to or less than the glass transition temperature, so that a joined body with high reliability can be produced.

DESCRIPTION OF EMBODIMENTS

While the aspect of the present invention is described in further details below with reference to Examples, the present invention is not limited only to the Examples.

Example 1

0.216 g of 1,4-Phenylenediamine (PPD) was added to 80 g of acetone and stirred to obtain a diamine solution. Then, the obtained diamine solution was irradiated with ultrasonic waves of 20 kHz and 600 W at 25° C. by using an ultrasonic device (UH-600S, from SMT Corporation) while stirring, 0.588 g of 4,4'-biphthalic anhydride (BPDA) in a non-solution state was quickly added to the diamine solution. Irradiation with ultrasonic waves was conducted for 30 minutes to progress the reaction and produce a polyamide acid. At this time, the produced polyamide acid was precipitated in the reaction solution, and polyamide acid particles (a) were obtained. The obtained polyamide acid particles (a) were isolated and then, dispersed in 146 g of decane, heated at 160° C. for 360 minutes for imidization treatment to obtain polyimide particles (a).

Note that, in the irradiation with ultrasonic waves, ultrasonic transducer of the ultrasonic device was immersed in the diamine solution to conduct irradiation with ultrasonic waves.

Example 2

Polyamide acid particles (b) and polyimide particles (b) were obtained in a manner similar to Example 1, except that 0.451 g of 5-amino-2-(p-aminophenyl)benzoxazole (DAMBO) was used instead of 0.216 g of 1,4-phenylenediamine (PPD) and 0.436 g of pyromellitic anhydride (PMDA) in a non-solution state was used instead of 0.588 g of 4,4'-biphthalic anhydride (BPDA) in a non-solution state.

Example 3

Polyamide acid particles (c) and polyimide particles (c) were obtained in a manner similar to Example 1, except that the ultrasonic device (US-4R, from AS ONE) was used instead of the ultrasonic device (UH-600S, from SMT Corporation) and irradiation with ultrasonic waves of 40 kHz and 160 W was conducted.

Note that, in the irradiation with ultrasonic waves, a beaker with the diamine solution was placed into a water tank of the ultrasonic device and irradiation with ultrasonic waves was conducted.

Example 4

Surface-treated polyamide acid particles (d) and polyimide particles (d) were obtained in a manner similar to Example 1, except that 0.0063 g of PITZCOL K-30 (from Dai-ichi Kogyo Seiyaku Co., Ltd., polyvinyl pyrrolidone) was added to and dissolved to the diamine solution.

Example 5

Polyamide acid particles (a) and polyimide particles (a) were obtained in a manner similar to Example 1. To an ethanol solution having 0.03 g of PITZCOL K-30 (from Dai-ichi Kogyo Seiyaku Co., Ltd., polyvinyl pyrrolidone) dissolved into 100 g of ethanol, 1 g of the obtained polyimide particles (a) was added, and sufficiently mixed with stirring. The polyimide particles were filtrated and then dried to obtain surface-treated polyimide particles (e).

Comparative Example 1

0.588 g of 4,4'-biphthalic anhydride (BPDA) was added to 48 g of DMF and stirred to obtain a tetracarboxylic anhydride solution. Also, 0.216 g of 1,4-phenylenediamine (PPD) was added to 40 g of acetone and stirred to obtain a diamine solution.

The obtained tetracarboxylic anhydride solution and diamine solution were mixed at 25° C. and stirred for 30 minutes, thereby reacting BPDA with PPD to produce a polyamide acid. At this time, the produced polyamide acid was in a dissolved state in the reaction solution. Then, the obtained reaction solution was dropped with a dropper into 316 g of acetone in a vessel while stirring. During the dropping, ultrasonic irradiation (20 kHz and 600 W at 25° C.) was conducted using an ultrasonic device (UH-600S, from SMT Corporation). By dropping the reaction solution in this way, polyamide acid particles (f) were quickly precipitated in acetone. The obtained polyamide acid particles (f) were isolated and then, dispersed in 146 g of decane, heated at 160° C. for 360 minutes for imidization treatment to obtain polyimide particles (f).

Note that, in the irradiation with ultrasonic waves, ultrasonic transducer of the ultrasonic device was immersed in acetone to conduct irradiation with ultrasonic waves.

Comparative Example 2

0.436 g of Pyromellitic anhydride (PMDA) was added to 40 g of acetone and stirred to obtain a tetracarboxylic anhydride solution. Also, 0.401 g of 4,4'-diaminodiphenyl ether (DPE) was added to 40 g of acetone and stirred to obtain a diamine solution.

The obtained tetracarboxylic anhydride solution and diamine solution were mixed at 25° C. at 20 kHz and 600 W using an ultrasonic device (UH-600S, from SMT Corporation), and stirred for 30 minutes, thereby reacting PMDA with DPE to produce a polyamide acid. At this time, the produced polyamide acid was precipitated in the reaction solution, and polyamide acid particles (g) were obtained. The obtained polyamide acid particles (g) were isolated and then, dispersed in 146 g of decane, heated at 160° C. for 360 minutes for imidization treatment to obtain polyimide particles (g).

Note that, in the irradiation with ultrasonic waves, ultrasonic transducer of the ultrasonic device was immersed in the solution to conduct irradiation with ultrasonic waves.

<Evaluation 1>

For polyamide acid particles and polyimide particles obtained in the Examples and Comparative Examples, the following evaluation was conducted. The results are shown in Table 1.

(1) Measurement of Average Particle Diameter

The polyamide acid particles or polyimide particles were observed with a scanning electron microscope (SEM). 50 or more particles in the obtained SEM photograph were arbitrarily chosen, and average particle diameter (nm) was determined by calculating the number average value from particle diameter of these arbitrary particles of 50 or more.

(2) Evaluation of Heat Resistance

The polyimide particles were heated from 30° C. to 300° C. at a temperature increase rate of 10° C./min using a thermogravimetric/differential thermal analyzer (TG/DTA) (EX-STAR 6000, from SII NanoTechnology Inc.). Weight loss ratio X after heating from 30° C. to 300° C. at a temperature increase rate of 10° C./min was calculated by the following formula from initial weight A and weight B after heating to 300° C. of the polyimide particles.

$$X = \{(A-B)/A\} \times 100 (\%)$$

(III). Note that the following (I) is the case where a tetracarboxylic anhydride in a solution state was added to manufacture polyamide acid particles and polyimide particles, and the following (II) is the case where a tetracarboxylic anhydride in a non-solution state was added to manufacture polyamide acid particles and polyimide particles.

(I) Production of Polyimide Particles (h) to (q) (Tetracarboxylic Anhydride: Solution State)

(Production of Polyimide Particles (h))

0.588 g of 4,4'-Biphthalic anhydride (BPDA) was added to 48 g of DMF and stirred to obtain a tetracarboxylic anhydride solution. Also, 0.216 g of 1,4-phenylenediamine (PPD) was added to 40 g of acetone and stirred to obtain a diamine solution.

The obtained tetracarboxylic anhydride solution and diamine solution were mixed at 25° C. and stirred for 30 minutes, thereby reacting BPDA with PPD to produce a polyamide acid. At this time, the produced polyamide acid was in a dissolved state in the reaction solution. Then, the obtained reaction solution was dropped with a dropper into 316 g of acetone in a vessel while stirring. During the dropping, ultrasonic irradiation (20 kHz at 25° C.) was conducted using an ultrasonic device (UH-600S, from SMT Corporation) at an output power of 5. By dropping the reaction solution in this way, polyamide acid particles (h) were quickly precipitated in acetone. The obtained polyamide acid particles (h) were isolated and then, dispersed in 146 g of decane, heated at 160° C. for 360 minutes for imidization treatment to be polyimide particles. Then, these polyimide particles were heat-treated in an oven at 400° C. for 30 minutes to obtain polyimide particles (h) (average particle diameter 0.08 CV value of the particle diameter 21%, weight loss ratio 1.6%).

(Production of Polyimide Particles (i))

Polyimide particles (i) (average particle diameter 0.1 μm, CV value of the particle diameter 18%, weight loss ratio 1.2%) were obtained in a manner similar to polyimide particles (h), except that 0.4362 g of pyromellitic anhydride

TABLE 1

| | Diamine compound | Tetracarboxylic anhydride | Ultrasonic device | Particles | Average particle diameter (nm) | Heat resistance (weight loss ratio) (%) |
|---|---|---|---|---|---|---|
| Example 1 | PPD | BPDA (non-solution state) | UH-600S (SMT) | Polyamide acid particles (a) | 350 | — |
| | | | | Polyimide particles (a) | 300 | 4.7 |
| Example 2 | DAMBO | PMDA (non-solution state) | UH-600S (SMT) | Polyamide acid particles (b) | 800 | — |
| | | | | Polyimide particles (b) | 750 | 2.5 |
| Example 3 | PPD | BPDA (non-solution state) | US-4R (AS ONE) | Polyamide acid particles (c) | 970 | — |
| | | | | Polyimide particles (c) | 900 | 4.8 |
| Example 4 | PPD | BPDA (non-solution state) | UH-600S (SMT) | Polyamide acid particles (d) (surface-treated) | 350 | — |
| | | | | Polyimide particles (d) (surface-treated) | 300 | 4.7 |
| Example 5 | PPD | BPDA (non-solution state) | UH-600S (SMT) | — | — | — |
| | | | | Polyimide particles (e) (surface-treated) | 300 | 4.8 |
| Comparative Example 1 | PPD | BPDA (in DMF) | UH-600S (SMT) | Polyamide acid particles (f) | 120 | — |
| | | | | Polyimide particles (f) | 100 | 12 |
| Comparative Example 2 | DPE | PMDA (in acetone) | UH-600S (SMT) | Polyamide acid particles (g) | 270 | — |
| | | | | Polyimide particles (g) | 250 | 12 |

Examples 6 to 21 and Comparative Example 3 to 9

After manufacturing polyimide particles according to the following (I) and (II), a bonding material for an electronic component was manufactured according to the following (PMDA) was used instead of 0.588 g of 4,4'-biphthalic anhydride (BPDA), 0.4505 g of 5-amino-2-(p-aminophenyl)benzoxazole (DAMBO) was used instead of 0.216 g of 1,4-phenylenediamine (PPD), and further 0.05 g of pyridine was used as a reaction catalyst.

(Production of Polyimide Particles (j))

Polyimide particles (j) (average particle diameter 0.5 µm, CV value of the particle diameter 30%, weight loss ratio 1.7%) were obtained in a manner similar to polyimide particles (h), except that output power of the ultrasonic device was set to 2 for a smaller intensity of ultrasonic waves with which the reaction solution was irradiated.

(Production of Polyimide Particles (k))

Polyimide particles (k) (average particle diameter 1 µm, CV value of the particle diameter 32%, weight loss ratio 2.0%) were obtained in a manner similar to polyimide particles (h), except that a table-top cleaner (B-2510)-MT, from Branson Ultrasonics, Emerson Japan, Ltd.) was used as the ultrasonic device and irradiation with ultrasonic waves of 42 kHz was conducted at 25° C.

(Production of Polyimide Particles (l))

Polyimide particles (l) (average particle diameter 3.0 µm, CV value of the particle diameter 45%, weight loss ratio 2.0%) were obtained in a manner similar to polyimide particles (h), except that irradiation with ultrasonic waves was not conducted and stirring was conducted using a homogenizer (from Kinematica AG, POLYTRON PT3100) instead of the ultrasonic device.

(Production of Polyimide Particles (m))

Polyimide particles (m) (average particle diameter 5 µm, CV value of the particle diameter 30%, weight loss ratio 2.5%) were obtained in a manner similar to polyimide particles (h), except that irradiation with ultrasonic waves was not conducted and stirring was conducted using a magnetic stirrer instead of the ultrasonic device.

(Production of Polyimide Particles (n))

Polyimide particles (n) (average particle diameter 0.5 µm, CV value of the particle diameter 58%, weight loss ratio 2.5%) were obtained in a manner similar to polyimide particles (h), except that, when the reaction solution was irradiated with ultrasonic waves while stirring and dropped into acetone, the amount of acetone subjected to the dropping was changed to 200 g.

(Production of Polyimide Particles (o))

0.4362 g of Pyromellitic anhydride (PMDA) was added to 40 g of acetone and stirred to obtain a tetracarboxylic anhydride solution. Also, 0.216 g of 1,4-phenylenediamine (PPD) was added to 40 g of acetone and stirred to obtain a diamine solution.

The obtained tetracarboxylic anhydride solution and diamine solution were irradiated with ultrasonic waves of 20 kHz at 25° C. by using ultrasonic device (UH-600S, from SMT Corporation) at an output power of 5 while stirring, and mixed, thereby reacting PMDA with PPD to precipitate polyamide acid particles. The obtained polyamide acid particles were isolated and then, dispersed in 146 g of decane, heated at 160° C. for 360 minutes for imidization treatment to obtain polyimide particles (o) (average particle diameter 0.5 µm, CV value of the particle diameter 7%, weight loss ratio 2.7%).

(Production of Polyimide Particles (p))

Surface-treated polyimide particles (p) (average particle diameter 0.08 µm, CV value of the particle diameter 21%, weight loss ratio 1.6%) were obtained in a manner similar to polyimide particles (h), except that, when the reaction solution was irradiated with ultrasonic waves while stirring and dropped into acetone, 316 g of acetone having 0.025 g of PITZCOL K-30 (from Dai-ichi Kogyo Seiyaku Co., Ltd., polyvinyl pyrrolidone) dissolved was used.

(Production of Polyimide Particles (q))

Polyamide acid particles (h) were obtained in a manner similar to the production method for the polyimide particles (h). To an ethanol solution having 0.03 g of PITZCOL K-30 (from Dai-ichi Kogyo Seiyaku Co., Ltd., polyvinyl pyrrolidone) dissolved into 100 g of ethanol, 1 g of the obtained polyimide particles (h) were added, and sufficiently mixed with stirring. The polyimide particles were filtrated and then dried to obtain surface-treated polyimide particles (q) (average particle diameter 0.08 µm, CV value of the particle diameter 21%, weight loss ratio 1.6%).

(II) Production of Polyimide Particles (r) to (x) (Tetracarboxylic Anhydride: Non-Solution State)

(Production of Polyimide Particles (r))

0.216 g of 1,4-Phenylenediamine (PPD) was added to 80 g of acetone and stirred to obtain a diamine solution. Then, the obtained diamine solution was irradiated with ultrasonic waves of 20 kHz and 600 W at 25° C. by using an ultrasonic device (UH-600S, from SMT Corporation) while stirring, 0.588 g of 4,4'-biphthalic anhydride (BPDA) in a non-solution state was quickly added to the diamine solution. Irradiation with ultrasonic waves was conducted for 30 minutes to progress the reaction and produce a polyamide acid. At this time, the produced polyamide acid was precipitated in the reaction solution to obtain polyamide acid particles (r). The obtained polyamide acid particles (r) were isolated and then, dispersed in 146 g of decane, heated at 160° C. for 360 minutes for imidization treatment to obtain polyimide particles (r) (average particle diameter 0.3 µm, CV value of the particle diameter 35%, weight loss ratio 4.7%).

Note that, in the irradiation with ultrasonic waves, ultrasonic transducer of UH-600S was immersed in the solution to conduct irradiation with ultrasonic waves.

(Production of Polyimide Particles (s))

Polyimide particles (s) (average particle diameter 0.75 µm, CV value of the particle diameter 35%, weight loss ratio 2.5%) were obtained in a manner similar to polyimide particles (r), except that 0.451 g of 5-amino-2-(p-aminophenyl) benzoxazole (DAMBO) was used instead of 0.216 g of 1,4-phenylenediamine (PPD), 0.436 g of pyromellitic anhydride (PMDA) in a non-solution state was used instead of 0.588 g of 4,4'-biphthalic anhydride (BPDA) in a non-solution state, and further 0.05 g of pyridine was used as a reaction catalyst.

(Production of Polyimide Particles (t))

Polyimide particles (r) were heat-treated in an oven at 400° C. for 30 minutes to obtain polyimide particles (t) (average particle diameter 0.26 µm, CV value of the particle diameter 35%, weight loss ratio 1.2%).

(Production of Polyimide Particles (u))

A diamine solution was irradiated with ultrasonic waves while stirring, and about 0.05 g out of 0.588 g of BPDA in a non-solution state was first added thereto to ensure its reaction, and after ascertaining the precipitation of the polyamide acid, about 0.05 g of BPDA was added again. Polyamide acid particles (u) (average particle diameter 0.25 µm, CV value of the particle diameter 12%, weight loss ratio 4.7%) were obtained in a manner similar to polyamide acid particles (r), except that this operation was repeated to add 0.588 g of BPDA in divided amounts.

(Production of Polyimide Particles (v))

Polyimide particles (v) (average particle diameter 0.7 µm, CV value of the particle diameter 45%, weight loss ratio 4.0%) were obtained in a manner similar to polyimide particles (s), except that pyridine as the reaction catalyst was not used and irradiation time with ultrasonic waves on the production of the polyamide acid was changed to 60 minutes.

(Production of Polyimide Particles (w))

Surface-treated polyimide particles (w) (average particle diameter 0.3 µm, CV value of the particle diameter 35%, weight loss ratio 4.7%) were obtained in a manner similar to polyimide particles (r), except that 0.0063 g of PITZCOL K-30 (from Dai-ichi Kogyo Seiyaku Co., Ltd., polyvinyl pyrrolidone) was added to and dissolved to the diamine solution.

(Production of Polyimide Particles (x))

Polyamide acid particles (r) were obtained in a manner similar to the method for producing polyimide particles (r). To an ethanol solution having 0.03 g of PITZCOL K-30 (from Dai-ichi Kogyo Seiyaku Co., Ltd., polyvinyl pyrrolidone) dissolved into 100 g of ethanol, 1 g of polyimide particles (r) were added, and sufficiently mixed with stirring. Polyimide particles were filtrated and then dried to obtain surface-treated polyimide particles (x) (average particle diameter 0.3 µm, CV value of the particle diameter 35%, weight loss ratio 4.7%).

Note that average particle diameter of the above obtained polyimide particles was determined by observing the polyimide particle with a scanning electron microscope (SEM), arbitrarily choosing 50 or more polyimide particles in the obtained SEM photograph, and calculating number average value from particle diameter of these arbitrary polyimide particles of 50 or more. CV value of the particle diameter of the polyimide particles was calculated by the following formula, from average particle diameter m and standard deviation a of the polyimide particles.

$$CV \text{ value }(\%) = \sigma/m \times 100$$

Also, weight loss ratio (X) of the above obtained polyimide particles was determined by heating polyimide particles from 30° C. to 300° C. at a temperature increase rate of 10° C./min by using a thermogravimetric/differential thermal analyzer (TG/DTA) (EXSTAR6000, from SII NanoTechnology Inc.) and then calculating by the following formula from initial weight A and weight B after heating to 300° C. of the polyimide particles.

$$X = \{(A-B)/A\} \times 100(\%)$$

(III) Production of Bonding Material for Electronic Component

According to the composition of tables 2 to 4, each of the materials indicated below was mixed with stirring by using a homodisperser to manufacture a bonding material for an electronic component. Paste-type bonding materials for an electronic component were manufactured in Examples 6 to 12 and 15 to 21 and Comparative Examples 3 and 4 and 6 to 9, and bonding materials for an electronic component in a sheet form were manufactured in Example 13 and 14 and Comparative Example 5. Note that, manufacture of a bonding material for an electronic component in a sheet form was tried in Comparative Example 5, but favorable forming into a sheet form could not be accomplished due to much surface roughness. On the other hand, a bonding material for an electronic component could be obtained in a favorable sheet form in Example 14, because the polyimide particles have adequate particle diameter distribution.

(1. Curable Compound)

Bisphenol A type epoxy resin (trade name "YL-980", from Japan Epoxy resins)

Bisphenol A type epoxy resin (trade name "1004AF", from Japan Epoxy resins)

Glycidyl group-containing acrylic resin (trade name "G-2050M", from NOF CORPORATION)

(2. Curing Agent)

Trialkyltetrahydrophthalic anhydride (trade name "YH306", from JER)

(3. Curing Accelerator)

Isocyanuric acid adduct of 2,4-diamino-6-[2'methylimidazoline-(1')]-ethyl s-triazine (trade name "2MA-OK", from SHIKOKU CHEMICALS CORPORATION)

(4. Polyimide Particles)

(4-1. Polyimide Particles of Average Particle Diameter 0.03-3 µm and CV Value 10-50%)

The above obtained polyimide particles (h) to (l) and (p) to (x)

(4-2. Other Polyimide Particles)

The above obtained polyimide particles (m) to (o) Polyimide particles (trade name "UIP-S", average particle diameter 10 µm, CV value of the particle diameter 15%, weight loss ratio 1.0%, from Ube Industries, Ltd.)

(5. Silica Particle)

Silica particles (trade name "Silfil NHM-5N", average particle diameter 0.07 µm, CV value of the particle diameter 12%, from Tokuyama Corporation)

Silica particles (trade name "SE2050SPJ", average particle diameter 0.5 µm, CV value of the particle diameter 10%, from Admatechs Co., Ltd.)

Silica particles (trade name "SE4050SPE", average particle diameter 1 µm, CV value of the particle diameter 10%, from Admatechs Co., Ltd.)

(6. Others)

Silane coupling agent (trade name "KBM-573", from Shin-Etsu Chemical Co., Ltd.)

Solvent (methyl ethyl ketone (MEK))

<Evaluation 2>

For bonding materials for an electronic component obtained in Examples and Comparative Examples, the following evaluation was conducted. The evaluation results are shown in Tables 2 to 4.

(1) Measurement of Linear Expansion Coefficient

From the obtained bonding material for an electronic component, cured objects having a thickness of 500 µm cured at 110° C. for 40 minutes and also at 170° C. for 30 minutes were manufactured, and a thermal stress/strain analyzer (model "EXTEAR TMA/SS 6100", from SII NanoTechnology Inc.) was used to increase temperature to 300° C. with load of 2N, at a temperature increase rate of 5° C./rain, and sample length of 1 cm, and from a slope of SS curve obtained at this time, linear expansion coefficient was determined.

(2) Measurement of Elastic Modulus

From the obtained semi-bonding materials for an electronic component, cured objects having a thickness of 500 µm cured at 110° C. for 40 minutes and also at 170° C. for 30 minutes were manufactured, a viscoelastic analyzer (model "DVA-200", from IT Keisoku Seigyo) was used to increase temperature to 300° C. at a temperature increase rate of 5° C./min, tensile and grip width of 24 mm, and 10 Hz, and then, values obtained by measurement at 25° C. and 170° C. were used as elastic modulus.

(3) Evaluation of Fluidity (Wetting and Spreading)

For the obtained bonding materials for an electronic component, the fluidity was evaluated using an air dispenser (SHOT MASTER 300, from Musashi Engineering, Inc.). At this time, the employed components were a precision nozzle (from Musashi Engineering, Inc., inner diameter 0.3 mm) and a 10 mL syringe (from Musashi Engineering, Inc.). Under the output conditions in which output pressure was 0.4 MPa and the gap between a glass substrate and a needle was 200 µm, bonding materials for an electronic component were applied onto the glass substrate, aiming at an amount output of 5 mg. Then, glass chips (10 mm×10 mm and thickness of 100 µm) were bonded onto the applied bonding materials for an electronic component, and these were placed into an oven at 80° C. for one hour.

The evaluation was conducted as follows: the case with the spreading of bonding materials for an electronic component to 90% or more of the area under the glass chip was considered to be "o", and the case with the spreading to less than 90% and 70% or more of the area under the glass chip was considered to be "Δ", and the case with the spreading to less than 70% of the area under the glass chip was considered to be "x".

Note that the present evaluation was not conducted in Examples 13 and 14 because bonding materials for an electronic component in a sheet form were manufactured. In Comparative Examples 3 and 4, the excessively large size of average particle diameter of the added polyimide particles was probably led to the results with a poor wetting and spreading.

(4) Cooling/Heating Cycle Test

Using a semiconductor chip (10 mm×10 mm×30 thickness) in which soldering balls were peripherally disposed and an substrate (glass/epoxy based FR-4) of 20 mm×20 mm×1.0 mm thickness in which, on electrical connection through the semiconductor chip, copper was wired to be in daisy chain with metal wiring within semiconductor chip, flip-chip installment (250° C., 10 seconds, 5 N) was performed using the obtained bonding materials for an electronic component. For the obtained samples, cooling/heating cycle test of 1000 cycles at −55° C. to 125° C. (10 minutes per each) was conducted and then, detachment among the semiconductor chips, the bonding materials for an electronic component, and the substrates was evaluated. Note that eight samples were evaluated and the number of samples in which detachment was found was evaluated.

TABLE 2

| | | | | | | | | Example | | | | | |
|---|---|---|---|---|---|---|---|---|---|---|---|---|---|
| | | | | | 6 | 7 | 8 | 9 | 10 | 11 | 12 | 13 | 14 |
| Composition of bonding material (weight parts) | Curable compound | | YL-980 | | 100 | 100 | 100 | 100 | 100 | 100 | 100 | — | — |
| | | | 1004AF | | — | — | — | — | — | — | — | 70 | 70 |
| | | | G-2050M | | — | — | — | — | — | — | — | 30 | 30 |
| | Curing agent | | YH306 | | 60 | 60 | 60 | 60 | 60 | 60 | 60 | 20 | 20 |
| | Curing accelerator | | 2MA-OK | | 8 | 8 | 8 | 8 | 8 | 8 | 8 | 8 | 8 |
| | Polyimide particles (average particle size: 0.03 to 3 μm, CV value: 10 to 50%) (tetracarboxylic anhydride: solution state) | (h) | Average particle diameter | 0.08 μm | 100 | — | — | — | — | — | — | 100 | 450 |
| | | | CV value | 21% | | | | | | | | | |
| | | | Weight loss ratio | 1.6% | | | | | | | | | |
| | | (i) | Average particle diameter | 0.1 μm | — | 100 | — | — | — | — | — | — | — |
| | | | CV value | 18% | | | | | | | | | |
| | | | Weight loss ratio | 1.2% | | | | | | | | | |
| | | (j) | Average particle diameter | 0.5 μm | — | — | 100 | — | — | — | — | — | — |
| | | | CV value | 30% | | | | | | | | | |
| | | | Weight loss ratio | 1.7% | | | | | | | | | |
| | | (k) | Average particle diameter | 1 μm | — | — | — | 100 | — | — | — | — | — |
| | | | CV value | 32% | | | | | | | | | |
| | | | Weight loss ratio | 2.0% | | | | | | | | | |
| | | (l) | Average particle diameter | 3.0 μm | — | — | — | — | 100 | — | — | — | — |
| | | | CV value | 45% | | | | | | | | | |
| | | | Weight loss ratio | 2.0% | | | | | | | | | |
| | | (p) (surface-treated) | Average particle diameter | 0.08 μm | — | — | — | — | — | 100 | — | — | — |
| | | | CV value | 21% | | | | | | | | | |
| | | | Weight loss ratio | 1.6% | | | | | | | | | |
| | | (q) (surface-treated) | Average particle diameter | 0.08 μm | — | — | — | — | — | — | 100 | — | — |
| | | | CV value | 21% | | | | | | | | | |
| | | | Weight loss ratio | 1.6% | | | | | | | | | |
| | Silane coupling agent | | KBM-573 | | 2 | 2 | 2 | 2 | 2 | 2 | 2 | 2 | 2 |
| | Solvent | | MEK | | — | — | — | — | — | — | — | 200 | 200 |
| Evaluation | Linear expansion coefficient | | Tg or lower (ppm/K) | | 44 | 35 | 46 | 46 | 45 | 44 | 43 | 43 | 31 |
| | | | Tg or higher (ppm/K) | | 114 | 95 | 112 | 112 | 116 | 114 | 113 | 115 | 70 |
| | Elastic modulus | | 25° C. (MPa) | | 2900 | 3000 | 2900 | 2800 | 2950 | 2900 | 2900 | 2950 | 3100 |
| | | | 170° C. (MPa) | | 58 | 80 | 60 | 62 | 59 | 58 | 59 | 59 | 61 |
| | Cooling/heating cycle test | | Number of samples with detachment | | 0 | 0 | 0 | 0 | 0 | 0 | 0 | 0 | 1 |
| | | | Wetting and spreading | | ○ | ○ | ○ | ○ | ○ | ○ | ○ | — | — |

TABLE 3

| | | | | | | Example | | | | | | |
|---|---|---|---|---|---|---|---|---|---|---|---|---|
| | | | | | | 15 | 16 | 17 | 18 | 19 | 20 | 21 |
| Composition of bonding material (weight parts) | Curable compound | | YL-980 | | | 100 | 100 | 100 | 100 | 100 | 100 | 100 |
| | | | 1004AF | | | — | — | — | — | — | — | — |
| | | | G-2050M | | | — | — | — | — | — | — | — |
| | Curing agent | | YH306 | | | 60 | 60 | 60 | 60 | 60 | 60 | 60 |
| | Curing accelerator | | 2MA-OK | | | 8 | 8 | 8 | 8 | 8 | 8 | 8 |
| | Polyimide particles (average particle | (r) | Average particle diameter | 0.3 μm | | 100 | — | — | — | — | — | — |
| | | | CV value | 35% | | | | | | | | |
| | | | Weight loss ratio | 4.7% | | | | | | | | |

TABLE 3-continued

| | | | | | Example | | | | | | |
|---|---|---|---|---|---|---|---|---|---|---|---|
| | | | | | 15 | 16 | 17 | 18 | 19 | 20 | 21 |
| | size: 0.03 to 3 µm, CV value: 10 to 50%) (tetracarboxylic anhydride: non-solution state) | (s) | Average particle diameter CV value Weight loss ratio | 0.75 µm 35% 2.5% | — | 100 | — | — | — | — | — |
| | | (t) | Average particle diameter CV value Weight loss ratio | 0.26 µm 35% 1.2% | — | — | 100 | — | — | — | — |
| | | (u) | Average particle diameter CV value Weight loss ratio | 0.25 µm 12% 4.7% | — | — | — | 100 | — | — | — |
| | | (v) | Average particle diameter CV value Weight loss ratio | 0.7 µm 45% 4.0% | — | — | — | — | 100 | — | — |
| | | (w) (surface-treated) | Average particle diameter CV value Weight loss ratio | 0.3 µm 35% 4.7% | — | — | — | — | — | 100 | — |
| | | (x) (surface-treated) | Average particle diameter CV value Weight loss ratio | 0.3 µm 35% 4.7% | — | — | — | — | — | — | 100 |
| | Silane coupling agent | | KBM-573 | | 2 | 2 | 2 | 2 | 2 | 2 | 2 |
| | Solvent | | MEK | | — | — | — | — | — | — | — |
| Evaluation | Linear expansion coefficient | | Tg or lower (ppm/K) Tg or higher (ppm/K) | | 45 100 | 36 94 | 44 100 | 44 100 | 37 95 | 45 100 | 43 98 |
| | Elastic modulus | | 25° C. (MPa) 170° C. (MPa) | | 2900 61 | 3000 80 | 2900 60 | 2890 61 | 3100 80 | 2900 61 | 2900 62 |
| | Cooling/heating cycle test | | Number of samples with detachment | | 0 | 0 | 0 | 0 | 0 | 0 | 0 |
| | | | Wetting and spreading | | ○ | ○ | ○ | ○ | ○ | ○ | ○ |

TABLE 4

| | | | | | Comparative Example | | | | | | |
|---|---|---|---|---|---|---|---|---|---|---|---|
| | | | | | 3 | 4 | 5 | 6 | 7 | 8 | 9 |
| Composition of bonding material (weight parts) | Curable compound | | YL-980 1004AF G-2050M | | 100 — — | 100 — — | — 70 30 | 100 — — | 100 — — | 100 — — | 100 — — |
| | Curing agent | | YH306 | | 60 | 60 | 20 | 60 | 60 | 60 | 60 |
| | Curing accelerator | | 2MA-OK | | 8 | 8 | 8 | 8 | 8 | 8 | 8 |
| | Other polyimide particles | (m) | Average particle diameter CV value Weight loss ratio | 5 µm 30% 2.5% | — | 100 | — | — | — | — | — |
| | | UIP-S | Average particle diameter CV value Weight loss ratio | 10 µm 15% 1.0% | 100 | — | — | — | — | — | — |
| | | (n) | Average particle diameter CV value Weight loss ratio | 0.5 µm 58% 2.5% | — | — | — | — | 100 | — | — |
| | | (o) | Average particle diameter CV value Weight loss ratio | 0.5 µm 7% 2.7% | — | — | — | 450 | — | — | — |
| | Silica particles | NHM-5N | Average particle diameter CV value | 0.07 µm 12% | — | — | — | — | — | — | 100 |
| | | SE2050SPJ | Average particle diameter CV value | 0.5 µm 10% | — | — | — | — | — | 100 | — |
| | | SE4050SPE | Average particle diameter CV value | 1 µm 10% | — | — | — | — | 100 | — | — |
| | Silane coupling agent | | KBM-573 | | 2 | 2 | 2 | 2 | 2 | 2 | 2 |
| | Solvent | | MEK | | — | — | 200 | — | — | — | — |
| Evaluation | Linear expansion coefficient | | Tg or lower (ppm/K) Tg or higher (ppm/K) | | 50 128 | 50 125 | — — | 45 113 | 48 125 | 47 124 | 50 140 |
| | Elastic modulus | | 25° C. (MPa) 170° C. (MPa) | | 3000 85 | 3000 85 | — — | 2900 60 | 5400 70 | 5500 68 | 6000 70 |
| | Cooling/heating cycle test | | Number of samples with detachment | | 5 | 1 | — | 1 | 8 | 8 | 8 |
| | | | Wetting and spreading | | x | x | — | x | ○ | ○ | ○ |

INDUSTRIAL APPLICABILITY

According to the present invention, it is possible to provide a method for producing polyamide acid particles that are used as a raw material for polyimide particles with a small average particle diameter having high heat resistance. Also, according to the present invention, it is possible to provide a method for producing polyimide particles using the method for producing polyamide acid particles, and polyimide particles produced by the method for producing polyimide particles. Also, according to the present invention, it is possible to provide a bonding material for an electronic component that, after being cured, linear expansion coefficient and elastic modulus in a temperature range equal to or less than the glass transition temperature become smaller and thus, a joined body with a high reliability can be produced.

The invention claimed is:

1. A method for producing polyamide acid particles comprising the steps of:
   preparing a solution having a diamine compound dissolved; and
   precipitating polyamide acid particles by adding a tetracarboxylic anhydride in a non-solution state to the solution having a diamine compound dissolved while applying a physical impact thereto.

2. The method for producing polyamide acid particles according to claim 1,
   wherein in the step of precipitating polyamide acid particles, the tetracarboxylic anhydride in a non-solution state is added to the solution having a diamine compound dissolved while irradiating the solution having a diamine compound dissolved with ultrasonic waves.

3. The method for producing polyamide acid particles according to claim 2,
   wherein when the solution having a diamine compound dissolved is irradiated with ultrasonic waves, an ultrasonic transducer is immersed in the solution having a diamine compound dissolved.

4. The method for producing polyamide acid particles according to claim 1,
   wherein the polyamide acid particles are surface-treated.

5. A method for producing polyimide particles comprising:
   preparing a solution having a diamine compound dissolved;
   precipitating polyamide acid particles by adding a tetracarboxylic anhydride in a non-solution state to the solution having a diamine compound dissolved while applying a physical impact thereto; and
   imidizing the polyamide acid particles.

6. The method for producing polyimide particles according to claim 5,
   wherein the polyimide particles are surface-treated.

* * * * *